US012785047B2

(12) United States Patent
Sugimoto

(10) Patent No.: US 12,785,047 B2
(45) Date of Patent: Nov. 3, 2026

(54) METHOD FOR SUPPLYING ASSOCIATIVE GAS TO SEMICONDUCTOR MANUFACTURING APPARATUS

(71) Applicant: Kuwana Metals, Ltd., Kuwana (JP)

(72) Inventor: Masato Sugimoto, Mie-ken (JP)

(73) Assignee: Kuwana Metals, Ltd. (JP)

( * ) Notice: Subject to any disclaimer, the term of this patent is extended or adjusted under 35 U.S.C. 154(b) by 97 days.

(21) Appl. No.: 18/848,571

(22) PCT Filed: Dec. 21, 2022

(86) PCT No.: PCT/JP2022/047207

§ 371 (c)(1),
(2) Date: Sep. 19, 2024

(87) PCT Pub. No.: WO2023/181548

PCT Pub. Date: Sep. 28, 2023

(65) Prior Publication Data

US 2025/0246448 A1 Jul. 31, 2025

(30) Foreign Application Priority Data

Mar. 24, 2022 (JP) ................................. 2022-049106

(51) Int. Cl.

*H01J 37/32* (2006.01)
*H10P 50/24* (2026.01)
*H10P 72/00* (2026.01)

(52) U.S. Cl.

CPC .... *H01J 37/32449* (2013.01); *H01J 37/3244* (2013.01); *H01J 37/32522* (2013.01);

(Continued)

(58) Field of Classification Search

None

See application file for complete search history.

(56) References Cited

U.S. PATENT DOCUMENTS

2020/0278084 A1* 9/2020 Saito .................... F17C 13/025

FOREIGN PATENT DOCUMENTS

JP 2004264881 A 9/2004
JP 2006031498 A 2/2006

(Continued)

OTHER PUBLICATIONS

Eurofluor (CTEF), "General Properties of Anhydrous Hydrogen Fluoride (AHF) and Hydrofluoric Acid Solutions (HF)", Belgium, Eurofluor (CTEF), Mar. 29, 2016, p. 10.

(Continued)

*Primary Examiner* — Atif H Chaudry
(74) *Attorney, Agent, or Firm* — NOD Law PC

(57) ABSTRACT

The present disclosure determines a maximum allowable pressure Pmax(T) at which it is possible to supply associative gas without causing association, on the basis of equilibrium vapor pressure data acquired for the associative gas, and adjusts the pressure and/or temperature of the associative gas such that the measured pressure of the associative gas does not exceed the maximum allowable pressure. The maximum allowable pressure Pmax(T) is preferably determined on the basis of a stable region of a conversion factor CF of the associative gas as referenced to a calibration gas with which association is unlikely to occur. This makes it possible to stably supply, to a semiconductor manufacturing device, associative gas with which chemical association readily occurs.

7 Claims, 5 Drawing Sheets

(52) U.S. Cl.
CPC ...... *H01J 37/32816* (2013.01); *H10P 50/242* (2026.01); *H10P 72/0402* (2026.01); *H10P 72/0421* (2026.01); *H10P 72/0602* (2026.01); *H10P 72/0604* (2026.01); *H01J 2237/334* (2013.01)

(56) References Cited

FOREIGN PATENT DOCUMENTS

| | | | |
|---|---|---|---|
| JP | 2007317696 | A | 12/2007 |
| JP | 2008053456 | A | 3/2008 |
| JP | 2008146641 | A | 6/2008 |
| JP | 2009087126 | A | 4/2009 |
| JP | 2020141038 | A | 9/2020 |
| JP | 2022114412 | A | 8/2022 |

OTHER PUBLICATIONS

Pct, International Search Report and Written Opinion issued in PCT/JP2022/047207, Mar. 14, 2023, 6 pages.

* cited by examiner

METHOD FOR SUPPLYING ASSOCIATIVE GAS TO SEMICONDUCTOR MANUFACTURING APPARATUS

FIELD

The present invention relates to a method for supplying associative gas to a semiconductor manufacturing apparatus.

BACKGROUND

In a manufacturing process of semiconductor devices such as integrated circuits, various kinds of gas are used depending on a purpose of the process. Among them, in particular, hydrogen fluoride gas is an indispensable material in manufacture of semiconductor devices as a gas suitable for etching treatment to remove oxide films. The boiling point of hydrogen fluoride is approximately 20° C. In order to supply hydrogen fluoride in a gaseous state to a semiconductor manufacturing apparatus, it is necessary to heat hydrogen fluoride gas in order to prevent it from liquefying.

Hydrogen fluoride gas is not only a gas that easily liquefies at room temperature, but also a gas that easily causes chemical association. It is known that molecules of hydrogen fluoride gas associate with each other through hydrogen bonds to form multimers with a degree of association of about 2 to 6. Hydrogen fluoride gas becomes more likely to associate as its temperature becomes lower and its pressure becomes higher. Separation of associated multimers into monomers is referred to as dissociation.

When association or dissociation of associative gas occurs, physical properties of the associative gas change significantly as a degree of association changes. An apparatus for supplying a gas to a semiconductor manufacturing apparatus is usually designed on the premise that molecular structure and physical properties of the gas do not change between a location where a flow rate measurement means measures a flow rate and a location where a flow rate control means controls the flow rate. Since this premise no longer holds true when association or dissociation of associative gas occurs inside the apparatus, it becomes difficult to supply the associative gas at a set flow rate. For this reason, methods for accurately supplying a quantitative amount of associative gas to a semiconductor manufacturing apparatus by preventing association and maintaining a dissociated state have been proposed.

For example, in Japanese Patent Application Laid-Open (kokai) No. 2004-264881 and Japanese Patent Application Laid-Open (kokai) No. 2006-31498, inventions of methods for supplying associative gas such as hydrogen fluoride gas while controlling its flow rate under conditions where temperature of a flow controller is set to 40° C. or higher and 85° C. or lower and a flow rate control range is limited to not less than 3 standard cubic centimeters per minute and not more than 300 standard cubic centimeters per minute when supplying the associative gas to a vacuum chamber are described. In accordance with these, it is possible to prevent the associative gas from associating and to make the gas into a theoretical single molecule state (dissociated state) and to let the gas pass through the flow controller by holding the temperature of the flow controller and the flow rate of the associative gas within the above ranges.

Moreover, for example, in Japanese Patent Application Laid-Open (kokai) No. 2008-146641 previously filed by the present applicant, an invention of a method in which temperature of a mass flow controller is set to 30° C. or higher and lower than 70° C. and pressure of associative gas such as hydrogen fluoride gas is set to 5 kilopascals or more and 40 kilopascals or less when supplying the associative gas to a processing apparatus is described. In addition to the above, JP 2008-146641 describes an invention of a method in which a conversion factor indicating a flow rate ratio of hydrogen fluoride gas and nitrogen gas is made independent of change in pressure and temperature when supplying the associative gas.

SUMMARY

In some aspects, the techniques described herein relate to a method for supplying associative gas which is likely to cause association to a semiconductor manufacturing apparatus, including: a step in which one associative gas is selected for the purpose of using in manufacture of semiconductor devices, a step in which data of equilibrium vapor pressure $P_e(T)$ as a function of temperature T for the selected associative gas is acquired, a step in which the maximum allowable pressure $P_{max}(T)$ at which the associative gas can be supplied without causing association is determined based on the data of the equilibrium vapor pressure $P_e(T)$, a step in which temperature $T_g$ and pressure $P_g$ of the associative gas supplied to the semiconductor manufacturing apparatus are measured, a step in which a value of the maximum allowable pressure $P_{max}(T_g)$ at the measured temperature $T_g$ is determined, and a step in which the pressure $P_g$ and/or the temperature $T_g$ are adjusted such that the measured pressure $P_g$ does not exceed a value of the determined maximum allowable pressure $P_{max}(T_g)$.

TECHNICAL PROBLEM

Figure 1:
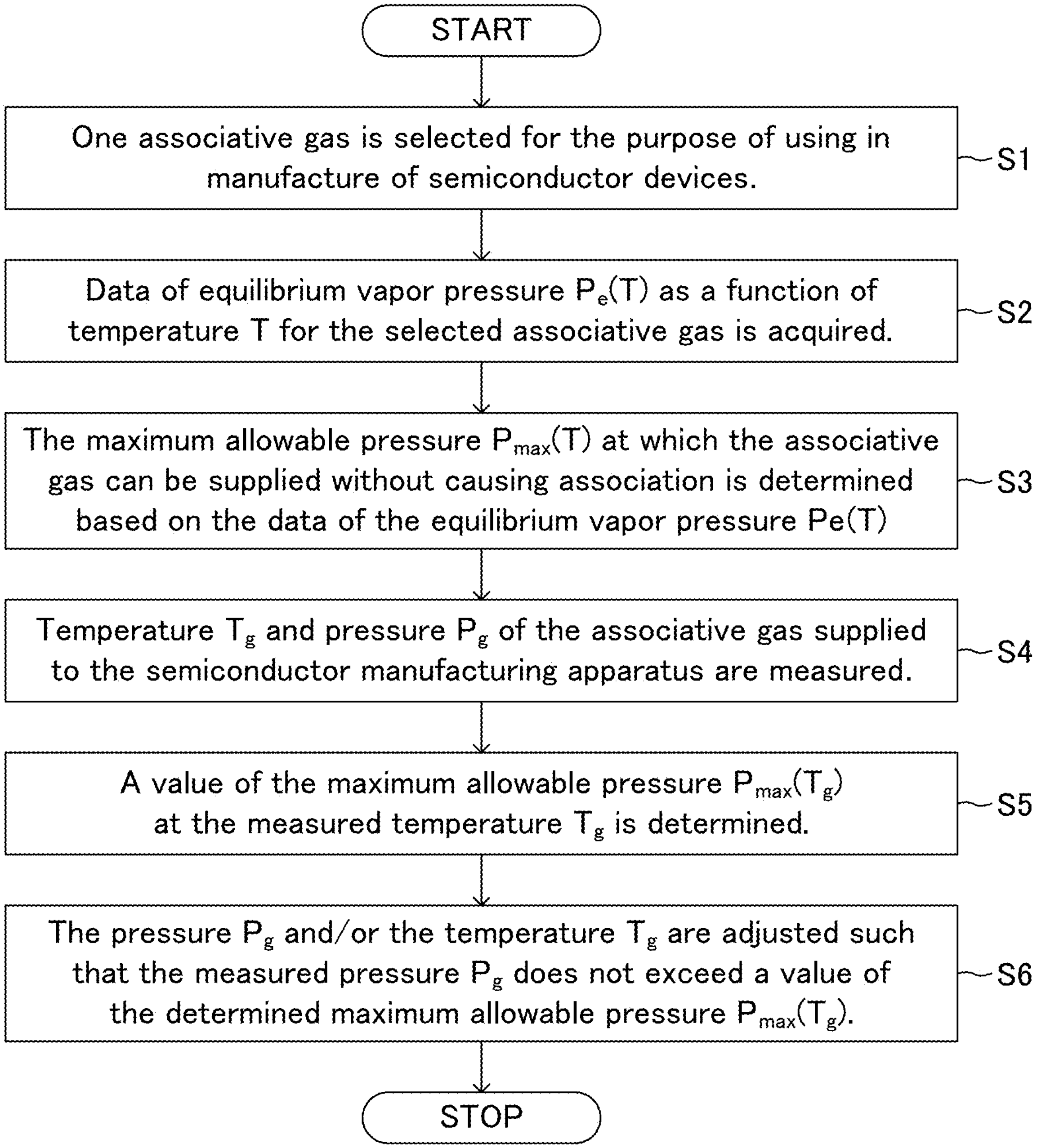
FIG. 1 is a block diagram for showing a method according to a first embodiment of the present invention.

In accordance with the above-mentioned conventional technologies, association of associative gas can be prevented by limiting a range of temperature or limiting ranges of temperature and pressure independently. However, since hydrogen fluoride gas becomes more likely to associate as its temperature becomes lower and its pressure becomes higher as mentioned above, there may have been conditions where the association may occur even within limited ranges of temperature and pressure when the ranges are limited independently. Alternatively, conversely, there may have been conditions where the association may be prevented even temperature and pressure are deviated from the limited ranges, and there is a risk that the limitations may be excessive.

Moreover, in the conventional technologies, conditions under which the association could be prevented had to be determined through trial and error. There is a possibility that the previously determined limit ranges may change when volume of an instrument used to supply the associative gas, a diameter and length of piping, or a configuration of a flow rate measuring means changes. When determining preferred ranges of temperature and pressure again, trial and error had to be carried out without any prospect, resulting in poor operation efficiency.

The present disclosure has been made in view of the above-mentioned problems, and an objective of the present disclosure is to provide a method for supplying associative gas at a correct flow rate by preventing association when supplying the associative gas to a semiconductor manufacturing apparatus.

Solution to Problem

The present disclosure relates to a method for supplying associative gas which is likely to cause association to a semiconductor manufacturing apparatus. In one embodiment, a method according to the present disclosure includes a step in which one associative gas is selected for the purpose of using in manufacture of semiconductor devices, a step in which data of equilibrium vapor pressure $P_e(T)$ as a function of temperature T for the selected associative gas is acquired, a step in which the maximum allowable pressure $P_{max}(T)$ at which the associative gas can be supplied without causing association is determined based on the data of the equilibrium vapor pressure $P_e(T)$, a step in which temperature $T_g$ and pressure $P_g$ of the associative gas supplied to the semiconductor manufacturing apparatus are measured, a step in which a value of the maximum allowable pressure $P_{max}(T_g)$ at the measured temperature $T_g$ is determined, and a step in which the pressure $P_g$ and/or the temperature $T_g$ are adjusted such that the measured pressure $P_g$ does not exceed the determined maximum allowable pressure $P_{max}(T_g)$.

In accordance with this configuration, the ranges of the pressure $P_g$ and/or temperature $T_g$ at which association of associative gas can be prevented can be determined rationally and easily based on the data of the equilibrium vapor pressure $P_e(T)$.

In a preferred embodiment, a method according to the present disclosure includes a step in which, with respect to a flow rate measuring means for measuring a flow rate of associative gas supplied to a semiconductor manufacturing apparatus per unit time, conversion factors CFs of the associative gas are determined at various temperature $T_g$ and pressure $P_g$ using a calibration gas which is less likely to cause association as a reference, a step in which a pressure threshold $P_t(T)$ corresponding to a boundary between a stable region and an unstable region is determined based on the data of the equilibrium vapor pressure $P_e(T)$, the stable region is a region where a rate of change of the conversion factor CF with respect to change in the temperature $T_g$ and/or pressure $P_g$ of the associative gas is less than a predetermined threshold or a difference between a conversion factor $CF_0$ in a state where the associative gas is not associated and the conversion factor CF is less than a predetermined threshold value, and the unstable region is a region where the rate of change of the conversion factor CF with respect to change in the temperature $T_g$ and/or pressure $P_g$ of the associative gas is not less than the predetermined threshold or the difference between the conversion factor $CF_0$ and the conversion factor CF is not less than the predetermined threshold value, and a step in which the maximum allowable pressure $P_{max}(T)$ is determined based on the determined pressure threshold $P_t(T)$. In accordance with this configuration, it is possible to more accurately determine presence or absence of the association of the associative gas via the conversion factor CF determined using the actual flow rate measuring means.

Advantageous Effects of Invention

In accordance with the present disclosure, since it is possible to more certainly prevent associative gas from associating as compared with the prior art when supplying the associative gas to a semiconductor manufacturing apparatus, accuracy of an amount of the supplied associative gas can be improved. As a result, it is possible to contribute to improvement of quality and productivity of semiconductor devices.

DESCRIPTION OF EMBODIMENTS

<Associative Gas>

The present invention relates to a method for supplying associative gas which is likely to cause association to a semiconductor manufacturing apparatus. Association means a phenomenon in which two to ten molecules of an identical substance join together and behave like one molecule. Molecules before association may be referred to as monomers, and an aggregate of associated molecules may be referred to as a multimer. The number of monomers constituting a multimer is referred to as a degree of association. The larger the degree of association becomes, the larger the molecular weight of the multimer becomes. In this specification, the term "associative gas" refers to gas which is likely to cause association. In addition, in this specification, "being likely to cause association" means that temperature and pressure ranges of a gas expected when supplying the gas to a semiconductor manufacturing apparatus partially overlaps with temperature and pressure ranges in which association of the gas occurs. A phenomenon that a multimer separates to return to the original monomers is referred to as dissociation. Generally, associative gas which tends to cause association is also a gas which tends to dissociate.

In order to manufacture semiconductor devices with a high yield using a semiconductor manufacturing apparatus, it is necessary to reproducibly control a supply rate of a gas supplied to a semiconductor manufacturing apparatus per unit time (which may be referred to as a "flow rate" hereafter) and total amount thereof. Generally, for the purpose of quantitatively supplying a gas to a semiconductor manufacturing apparatus, a mass flow controller is used. A mass flow controller comprises a flow sensor as a flow rate measuring means for measuring a flow rate of a gas, a flow control valve as a flow rate control means for controlling a flow rate of the gas, and a control part for controlling these. The flow sensor and the flow rate control valve are generally provided at different locations on a flow passage of a gas.

In a case where associative gas is supplied to a semiconductor manufacturing apparatus using a mass flow controller, when association or dissociation of associative gas occurs inside a mass flow controller, there is a risk that a flow rate of the associative gas may not be controlled correctly. This is because association or dissociation of the associative gas significantly changes physical properties of the associative gas which affect a flow rate measured by a flow sensor. The present invention provides a reliable and simple means for stably supplying associative gas to a semiconductor manufacturing apparatus while avoiding such inconvenient phenomena.

First Embodiment

FIG. 1 is a block diagram for showing a method according to a first embodiment of the present invention. The method according to the first embodiment includes a total of six steps. The first step S1 is a step in which one associative gas is selected for the purpose of using in manufacture of semiconductor devices. One of typical associative gas used in the manufacture of semiconductor devices is hydrogen fluoride gas. Since hydrogen fluoride gas is highly reactive and can react with and remove oxide film on a surface of a silicon wafer, it is often used in dry etching in the manufacture of semiconductor devices. However, associative gas selected in the first embodiment is not limited to hydrogen fluoride gas. Any associative gas which may cause association or dissociation during a process of being supplied to a semiconductor manufacturing apparatus may be selected in the first step S1. In addition to the hydrogen fluoride, associative gas used in the manufacture of semiconductor devices include, for example, hydrogen bromide and tungsten hexafluoride, and the like.

In the first step S1, the purpose of use of the selected associative gas in manufacture of semiconductor devices is not limited. In the present invention, "use" of associative gas in a semiconductor manufacturing apparatus should be interpreted in the broadest sense. The associative gas may be contained somewhere in a final product as a part of thin film which constitutes the semiconductor device to be manufactured, may react with a surface of the thin film during the manufacturing process of the semiconductor devices and be discharged out of the apparatus, may simply adjusts an atmosphere inside the semiconductor manufacturing apparatus, or may be used for purposes other than these purposes.

The second step S2 in the first embodiment is a step in which data of equilibrium vapor pressure $P_e(T)$ as a function of temperature T for the selected associative gas is acquired. The equilibrium vapor pressure refers to the pressure of the selected associative gas when a closed system in which the associative gas and a liquid that is the associative gas condensed as a liquid coexist is in an equilibrium state at a certain temperature. From a macroscopic perspective, an equilibrium state is a state in which amounts of gas and liquid in a system do not change apparently. Moreover, from a microscopic perspective, an equilibrium state is a state in which the number of associative gas molecules which fly out from a liquid surface per second is the same as the number of associative gas molecules which enter the liquid through the liquid surface per second. When the system is in an equilibrium state, this vapor pressure exhibits a constant value at a certain temperature T, namely the equilibrium vapor pressure $P_e(T)$. Generally, the higher the temperature T becomes, the higher the equilibrium vapor pressure $P_e(T)$ becomes.

In this specification, a part (T) in the symbol $P_e(T)$ indicating the equilibrium vapor pressure indicates that the equilibrium vapor pressure Pe is a function of temperature T. This principle in notation of symbols also applies to symbols representing other variables, which will be described later.

In the second step S2, the data of the equilibrium vapor pressure $P_e(T)$ can be determined in advance by experiments for the associative gas. Regarding associative gas whose properties are well known, the data may be obtained from data measured in the past by research institutions and the like and published in publicly known literature. The data obtained from the well-known literature may be discontinuous and discrete regarding the temperature T, for example. In such cases, the equilibrium vapor pressure $P_e(T)$ at a temperature between two actually measured temperatures may be calculated by data interpolation, or may be calculated by using a function approximated by a polynomial or other approximate expression, in the first embodiment.

In the second step S2, it is preferable that the data of the equilibrium vapor pressure $P_e(T)$ is acquired for a temperature range including an actual temperature of the associative gas to be supplied to the semiconductor manufacturing apparatus. In such cases, the acquired data can be used directly to determine the maximum allowable pressure which will be mentioned later. However, when this is not possible, for example, it is allowable to acquire data of a plurality of the equilibrium vapor pressures $P_e(T)$ at temperatures as close as possible to the actual temperature of the associative gas to be supplied to the semiconductor manufacturing apparatus and to regard extrapolation of the data as data of the equilibrium vapor pressure data at that temperature, in the first embodiment.

In the second step S2, the data on the equilibrium vapor pressure $P_e(T)$ acquired as a function of temperature may include data in a temperature range in which association or dissociation of the associative gas occurs. As long as an equilibrium state between gas and liquid phases is maintained, molecules of a monomeric associative gas and molecules of a multimeric associative gas may coexist in the gas phase; and further multimers may exist in the liquid phase. In this closed system, in addition to the chemical equilibrium between the gas and liquid phases, chemical equilibrium between the monomers and multimers is also established simultaneously.

The third step S3 in the first embodiment is a step in which the maximum allowable pressure $P_{max}(T)$ at which the associative gas can be supplied without causing association is determined based on the data of the equilibrium vapor pressure $P_e(T)$. As mentioned above, the equilibrium vapor pressure $P_e(T)$ is a function of the temperature T, and as the temperature T changes, the value of the equilibrium vapor pressure $P_e(T)$ also changes. Generally, the higher the temperature T of the associative gas becomes, the higher the equilibrium vapor pressure $P_e(T)$ becomes. The maximum allowable pressure $P_{max}(T)$ is determined based on the data of the equilibrium vapor pressure $P_e(T)$. Therefore, the maximum allowable pressure $P_{max}(T)$ determined in this way can be also expressed as a function of the temperature T at which change in the temperature T of the associative gas is indirectly reflected through change in the equilibrium vapor pressure $P_e(T)$.

The maximum allowable pressure $P_{max}(T)$ in the third step S3 refers to the maximum value of pressure at which the associative gas can be supplied without causing association, and the value varies depending on the temperature T of the associative gas. When the temperature T of the associative gas is constant, the higher the pressure P becomes, the more likely the association will occur. This is because the higher the pressure P becomes, the higher the probability that molecules will collide with each other becomes. When the pressure P of the associative gas is constant, the higher the temperature T becomes, the more likely dissociation will occur. This is because the bonds between molecules are broken due to the thermal movement of the molecules. As will be mentioned later, by handling the associative gas such that the pressure P of the associative gas does not exceed the maximum allowable pressure $P_{max}(T)$, the associative gas can be stably supplied without causing association.

In the third step S3, "the maximum allowable pressure $P_{max}(T)$ is determined based on the data of the equilibrium vapor pressure $P_e(T)$" means that the maximum allowable pressure $P_{max}(T)$ is determined in an embodiment in which a difference in the magnitude of the equilibrium vapor pressure $P_e(T)$ which changes depending on the temperature T of the associative gas is reflected, as described above. In determining the maximum allowable pressure $P_{max}(T)$ in the first embodiment, it is sufficient that the difference in the magnitude of the equilibrium vapor pressure $P_e(T)$ is reflected in some way, and a specific method and means therefor are not limited.

In many cases, the maximum allowable pressure $P_{max}(T)$ for preventing the selected associative gas from association can be determined by repeating experiments under various conditions to accumulate data and analyzing the data. Conventionally, the ranges of the temperature T and pressure P within which the associative gas can be stably supplied have been individually determined based on the accumulated data. In this conventional technology, it was necessary to carry out a large number of experiments without firm guidelines for many combinations of the temperature T and pressure P of the associative gas. In the first embodiment, by introducing a concept of the equilibrium vapor pressure $P_e(T)$ which is a function of temperature T and the maximum allowable pressure $P_{max}(T)$ determined based on the equilibrium vapor pressure $P_e(T)$, prospect of the experiments becomes clear and conditions for handling the associative gas can be determined with fewer experiments than that in the prior art.

The fourth step S4 in the first embodiment is a step in which temperature $T_g$ and pressure $P_g$ of the associative gas supplied to the semiconductor manufacturing apparatus are measured. Positions at which the temperature $T_g$ and pressure $P_g$ of the associative gas are measured are not limited. Namely, the temperature $T_g$ and pressure $P_g$ of the associative gas need only to be measured at any position in a flow passage of the associative gas from associative gas supply source to the semiconductor manufacturing apparatus. The temperature $T_g$ and pressure $P_g$ may be measured at the same or different positions. Known measuring means can be used to measure the temperature $T_g$ and pressure $P_g$ of the associative gas. For example, a temperature sensor can be used to measure the temperature $T_g$ and a pressure sensor can be used to measure the pressure $P_g$. The temperature $T_g$ and pressure $P_g$ may be measured simultaneously by a combined sensor.

Values of the temperature $T_g$ and pressure $P_g$ of the associative gas measured in the fourth step S4 are used in subsequent steps S5 and S6. Timings of measuring the temperature $T_g$ and the pressure $P_g$ may be immediately before executing step S5 and step S6, or may be earlier timings. In the step S4, measurements of the temperature $T_g$ and pressure $P_g$ of the associative gas may be done one when the measured data of the temperature $T_g$ and pressure $P_g$ are stable without changing over time. It is preferable to repeat the measurements many times together with subsequent steps S5 and S6 when the data changes over time. A frequency of repeating the measurements can be determined properly depending on conditions such as an extent of change in the data.

The fifth step S5 of the first embodiment is a step in which a value of the maximum allowable pressure $P_{max}(T_g)$ at the measured temperature $T_g$ is determined. As mentioned above, the maximum allowable pressure $P_{max}(T)$ is determined as a function of the temperature T in the step S3. By inputting the temperature $T_g$ measured in the step S4 into this function, the value of the maximum allowable pressure $P_{max}(T_g)$ at the temperature $T_g$ can be determined.

The sixth step S6 of the first embodiment is a step in which the pressure $P_g$ and/or the temperature $T_g$ are adjusted such that the measured pressure $P_g$ does not exceed the value of the determined maximum allowable pressure $P_{max}(T_g)$. The associative gas whose pressure $P_g$ and/or temperature $T_g$ is to be controlled is the associative gas located at the same position as the associative gas whose temperature $T_g$ and pressure $P_g$ were measured in the step S4. More specifically, the associative gas existing in the flow passage from the associative gas supply source to the semiconductor manufacturing apparatus is a target of control. However, in a state where the associative gas is being supplied to the semiconductor manufacturing apparatus, the associative gas is constantly flowing in this flow passage. Therefore, more precisely, the associative gas flowing inside this flow passage is a target of the control of the pressure $P_g$ and/or temperature $T_g$.

Adjustment of the pressure $P_g$ in the sixth step S6 can be performed as follows, for example. First, when the pressure $P_g$ is measured by a pressure sensor, a pressure control means is disposed upstream of a position where the pressure sensor is disposed in a flow passage of the associative gas. For example, a mechanical pressure control valve or an electronically controlled pressure control valve can be employed as the pressure control means. Next, when the measured value of the pressure $P_g$ exceeds the maximum allowable pressure $P_{max}(T_g)$ at the temperature $T_g$, the pressure control means is operated to gradually lower the pressure $P_g$ of the associative gas flowing through the flow passage while monitoring an indicated value of the pressure $P_g$. Then, the operation of the pressure control means is ended when the pressure $P_g$ no longer exceeds the value of the maximum allowable pressure $P_{max}(T_g)$.

When the value of the pressure $P_g$ does not exceed the maximum allowable pressure $P_{max}(T_g)$ before operating the pressure control means, supply of the associative gas can be continued at the current pressure $P_g$ without operating the pressure control means. Alternatively, the value of the pressure $P_g$ may be increased or decreased within a range that does not exceed the value of maximum allowable pressure $P_{max}(T_g)$. When adjusting the pressure $P_g$, it is preferable to do so while keeping the temperature $T_g$ of the associative gas constant.

The pressure in the sixth step S6 can also be controlled by controlling the temperature $T_g$ of the associative gas as follows, for example. First, a gas heating means is disposed in the flow passage of the associative gas. For example, a heater can be used as the heating means. Next, when the value of the pressure $P_g$ exceeds the value of the maximum allowable pressure $P_{max}(T_g)$ at the temperature $T_g$, the heating means is activated to raise the temperature $T_g$ of the associative gas flowing through the flow passage. Since the value of the equilibrium vapor pressure $P_e(T_g)$ also increases in association with the rise in the temperature $T_g$, the value of the maximum allowable pressure $P_{max}(T_g)$ determined based thereon also increases. When the pressure $P_g$ of the associative gas changes in association with heating, the pressure $P_g$ after heating is measured again. Then, at a time point when the value of the maximum allowable pressure $P_{max}(T_g)$ exceeds the value of the pressure $P_g$, heating conditions are fixed and the adjustment is ended.

Although a method for adjusting only either the pressure $P_g$ or the temperature $T_g$ of the associative gas was explained in the above, the pressure $P_g$ and temperature $T_g$ of the associative gas can be adjusted simultaneously or one by one at a time interval. Since an adjustment method in this case is basically the same as the method explained in the above, detailed explanation thereof will be omitted here.

In accordance with the above-mentioned method according to the first embodiment, associative gas can be supplied to a semiconductor manufacturing apparatus under conditions of temperature and pressure under which association and dissociation can be reliably prevented. One of reasons which enable such a thing is that the range of the pressures at which the associative gas should be handled is determined using the data on the equilibrium vapor pressure as a function of temperature. In the prior art, numerical ranges of temperature and pressure are determined independently as conditions under which association of associative gas does not easily occur based on experimental data. More specifically, the minimum and maximum values of temperature and the minimum and maximum values of pressure were determined independently, and the associative gas was handled at a temperature and pressure that satisfied both of these numerical ranges.

However, in this conventional technology, since the numerical ranges are determined taking into account only one of the temperature and pressure which are considered to affect the association, not only it lacks rationality but also there was a risk that the numerical limitations may be limited excessively or, conversely, the numerical limitations were insufficient. On the contrary to this, in the method according to the first embodiment, by introducing a concept of an equilibrium vapor pressure which is a function of temperature, conditions can be determined while considering temperature and pressure simultaneously.

Although it is not clear why it is effective to refer to the equilibrium vapor pressure when dealing with the problem of association, it is thought that the following can be said probably. Namely, as mentioned above, equilibrium vapor pressure is a pressure of a gas phase in an equilibrium state in which the number of molecules jumping from a liquid phase to the gas phase and the number of molecules jumping from the gas phase to the liquid phase per unit time are equal to each other. The higher the temperature of the system becomes, the larger kinetic energy which molecules have becomes, and therefore the number of molecules breaking away from condensation force (cohesion) in the liquid phase to jump out into the gas phase increases. For this reason, the higher the temperature becomes, the higher the equilibrium vapor pressure becomes. It can be thought that the same thing as this applies to the dissociation of polymers; the higher the temperature becomes, the more polymers of the associative gas will break away from intermolecular forces to dissociate, and return to monomers. Since it can be thought that evaporation and dissociation can be considered to be very similar phenomena as the above, it can be thought that, as for identical molecules, influence of temperature on dissociation and influence of temperature on evaporation could be correlated with each other.

However, although evaporation and dissociation can be considered to be very similar phenomena, there is a large difference in an extent between the condensation force (cohesion) of the molecules in the liquid phase and the intermolecular force of the multimers. For example, it is known that the boiling point of hydrogen fluoride at atmospheric pressure is around 20° C., while the degree of association of hydrogen fluoride gas at the boiling point is around 3.5, and it is necessary to raise the temperature of hydrogen fluoride gas to about 80° C. in order to dissociate this completely. From this, it can be thought that, in the case of hydrogen fluoride gas, energy required for dissociation is larger than energy required for evaporation. In other words, hydrogen fluoride gas associates more easily than it condenses to liquefy. Therefore, it is insufficient to simply hold the pressure of hydrogen fluoride gas at a pressure lower than the equilibrium vapor pressure is insufficient to prevent association for preventing association, and that is why it is necessary to hold the pressure at a pressure further lower than the equilibrium vapor pressure. This is why the maximum allowable pressure $P_{max}(T_g)$ is determined based on the equilibrium vapor pressure $P_e(T)$ instead of directly adopting the equilibrium vapor pressure $P_e(T)$ as the maximum allowable pressure $P_{max}(T_g)$ in the first embodiment. Thus far, there has been no known literature which discloses a discussion of the association and dissociation phenomena of associative gas in comparison with the condensation and evaporation phenomena.

Second Embodiment

Figure 2:
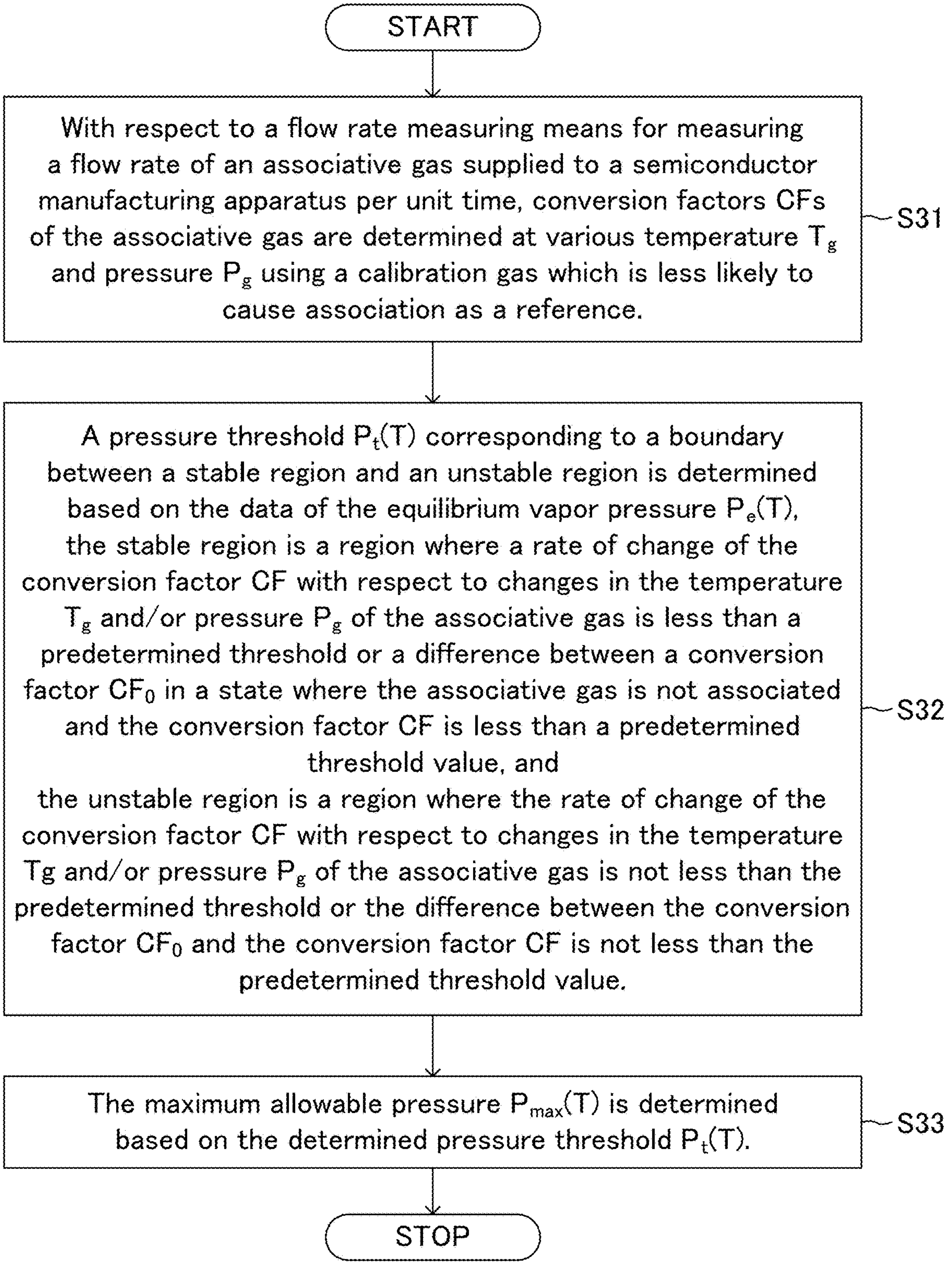
FIG. 2 is a block diagram for showing a method according to a second embodiment of the present invention.

FIG. 2 is a block diagram for showing a method according to a second embodiment of the present invention. A method according to a second embodiment is a method with the more specifically concretized step S3 in which the maximum allowable pressure $P_{max}(T_g)$ is determined based on the equilibrium vapor pressure $P_e(T)$ in the first embodiment. The method according to the second embodiment further includes a total of three more steps. A first step S31 is a step in which, with respect to a flow rate measuring means for measuring a flow rate of associative gas supplied to a semiconductor manufacturing apparatus per unit time, conversion factors CFs of the associative gas are determined at various temperature $T_g$ and pressure $P_g$ using a calibration gas which is less likely to cause association as a reference.

The flow rate measuring means can be disposed at any location in the flow passage for supplying the associative gas to the semiconductor manufacturing apparatus. The flow rate measuring means can be constituted by a flow sensor, for example. The flow rate measuring means may be a flow sensor built in a mass flow controller, or a flow sensor built in a mass flow meter which does not have a means for controlling a mass flow rate. As the flow rate measuring means in the second embodiment, known means such as a thermal flow sensor and a pressure type flow sensor, etc. can be employed.

The conversion factor CF of associative gas when using a calibration gas which does not easily cause association as a reference refers to a ratio f/f0 of an actual flow rate f of associative gas measured using another flow rate measuring means to a reference value f0 when a flow rate of the associative gas measured using a flow rate measuring means calibrated with a calibration gas which does not easily cause association is the reference value f0. As other flow rate measuring means include, there are a method in which a gas flowing through a flow rate measuring means is stored in a container and change in weight of a container is measured and a method in which change in pressure inside the container in which the gas is collected is measured, etc., for example. As units of a flow rate, for example, standard cubic centimeter per minute, which represents a volumetric flow rate under standard conditions (25° C., 1 atm), can be used.

As a calibration gas which does not easily cause association, a gas which is chemically stable and does not liquefy or associate in a temperature range in which the gas is used. Since nitrogen gas is chemically stable and its constant pressure specific heat does not change much with temperature, it is suitable as a calibration gas used in the step S31 as a gas which does not easily cause association and. From the above-mentioned definition, when nitrogen gas is used to calibrate the flow rate measurement means, the conversion factor CF of nitrogen gas is always 1, and the conversion factors CFs of gas other than nitrogen gas often have values different from 1.

A value of a flow rate indicated by the flow rate measurement means as a measured value is affected by physical properties of a gas whose flow rate is being measured. In a case where the flow rate measuring means is constituted by a thermal flow sensor, when the constant pressure specific heat of the gas changes, the value of its flow rate also changes. It can be said that the conversion factor CF for a certain gas is a correction coefficient which indicates sensitivity of the flow rate measuring means for that gas. For example, when a volumetric flow rate indicated by the flow rate measuring means for a gas other than a calibration gas is 1.0 standard cubic centimeters, its actual flow rate can be determined as a value of 1.0 standard cubic centimeters multiplied by the conversion factor CF of that gas.

In the step S31, for various combinations of temperature and pressure, the conversion factors CFs are measured, and the data is accumulated. When the flow rate measuring means is constituted by a thermal flow sensor, for example, it is known that the conversion factor CF depends on the constant pressure specific heat and other physical properties of the gas related to the flow rate measurement. Therefore, when the physical properties of the gas change in association with change in temperature and pressure, its conversion factor CF also changes. Under conditions in which association and dissociation do not occur, since changes in physical properties due to changes in temperature and pressure are gradual, the change in conversion factor CF is also relatively gradual. However, under conditions where association and dissociation of associative gas occur, since the physical properties of associative gas change significantly, the conversion factor CF also changes significantly. Namely, for associative gas, there are a stable region where the conversion factor CF does not change much depending on the temperature and pressure conditions, and an unstable region where the conversion factor CF changes significantly.

The second step S32 in the second embodiment is a step in which a pressure threshold $P_t(T)$ corresponding to a boundary between a stable region and an unstable region is determined based on the data of the equilibrium vapor pressure $P_e(T)$. The stable region is a region where a rate of change of the conversion factor CF with respect to change in the temperature $T_g$ and/or pressure $P_g$ of the associative gas is less than a predetermined threshold or a difference between a conversion factor $CF_0$ in a state where the associative gas is not associated and the conversion factor CF is less than a predetermined threshold value. The unstable region is a region where the rate of change of the conversion factor CF with respect to change in the temperature $T_g$ and/or pressure $P_g$ of the associative gas is not less than the predetermined threshold or the difference between the conversion factor $CF_0$ and the conversion factor CF is not less than the predetermined threshold value. As described above, since the conversion factor CF of associative gas has a stable region and an unstable region, the temperature and pressure corresponding to the boundary between the stable region and the unstable region can be specified as the pressure threshold $P_t(T)$. Here, the pressure threshold $P_t(T)$ is a function of temperature T.

In this specification, the "stable region where a rate of change of the conversion factor CF with respect to change in the temperature $T_g$ and/or pressure $P_g$ of the associative gas is less than a predetermined threshold" refers to a region in which the conversion factor CF determined in the step S31 is stable and does not change much with respect to change in the temperature $T_g$ and/or pressure $P_g$ of the associative gas, in other words. In addition, the "stable region where a difference between a conversion factor $CF_0$ in a state where the associative gas is not associated and the determined conversion factor CF is less than a predetermined threshold value" means that a region of the temperature $T_g$ and pressure $P_g$ that exhibits a conversion factor CF whose difference from the conversion factor $CF_0$ that is a conversion factor in a state where the associative gas is not associated and has a low rate of change is less than a predetermined threshold value is regarded as the stable region.

On the other hand, in this specification, the "unstable region where the rate of change of the conversion factor CF with respect to change in the temperature $T_g$ and/or pressure $P_g$ of the associative gas is not less than the predetermined threshold" refers to a region in which the conversion factor CF determined in the step S31 is changes largely with respect to change in the temperature $T_g$ and/or pressure $P_g$ of the associative gas and unstable, in other words. In addition, the "unstable region where the difference between the conversion factor $CF_0$ and the conversion factor CF is not less than the predetermined threshold value" means that a region of the temperature $T_g$ and pressure $P_g$ that exhibits a conversion factor CF whose difference from the conversion factor $CF_0$ that is a conversion factor in a state where the associative gas is not associated and has a low rate of change is not less than the predetermined threshold value is regarded as the unstable region.

The stable region and unstable region of the conversion factor CF defined as the above can be specified as ranges of values determined by combinations of two variables, the temperature $T_g$ and the pressure $P_g$ of the associative gas. Specifically, these regions can be expressed as two regions on a two-dimensional graph with temperature $T_g$ and pressure $P_g$ as axes, and a boundary which can be represented by a straight line or a curved line exists between them. When the temperature $T_g$ and/or pressure $P_g$ of the associative gas changes across this boundary, the state of the associative gas changes from the stable region to the unstable region or changes conversely. In the second step S32, the temperature and pressure corresponding to this boundary are determined as the pressure threshold $P_t(T)$.

As mentioned above, since dissociation and evaporation can be considered to be similar phenomena, the pressure threshold $P_t(T)$ and the equilibrium vapor pressure $P_e(T)$, both of which are functions of temperature T, are expected to exhibit similar behavior. When actually observing, it will be found that a simple relation such as a proportional relation always exists between the two. By utilizing this property, the pressure threshold $P_t(T)$ can be determined based on the data of the equilibrium vapor pressure $P_e(T)$.

A third step S33 in the second embodiment is a step in which the maximum allowable pressure $P_{max}(T)$ is determined based on the determined pressure threshold $P_t(T)$. As mentioned above, the pressure threshold $P_t(T)$ is determined based on the data of the equilibrium vapor pressure $P_e(T)$. Therefore, in the step S33, the maximum allowable pressure $P_{max}(T)$ is determined based on the data of the equilibrium vapor pressure $P_e(T)$ via the pressure threshold $P_t(T)$. However, unlike the data of the equilibrium vapor pressure $P_e(T)$ in the case of the first embodiment, a value of the pressure threshold $P_t(T)$ is a value directly related to the presence or absence of association of associative gas. Therefore, it is permitted to determine the pressure threshold $P_t(T)$ itself as the maximum allowable pressure $P_{max}(T)$ in the second embodiment.

The advantages of introducing the conversion factor CF into the process for determining the maximum allowable pressure $P_{max}(T)$ in the second embodiment are as follows. As mentioned above, the conversion factor CF is determined using the flow rate measurement means actually used for supplying the associative gas. The flow sensor constituting the flow rate measuring means has unique characteristics. For example, since a thermal flow sensor and a pressure flow sensor have different measurement principles of a flow rate, the degrees of change in the conversion factor CF with respect to temperature and pressure are also different. Moreover, even when the flow sensors are of the same type, the conversion factor CF may change due to individual variations. Even in such a case, since the maximum allowable pressure $P_{max}(T)$ can be determined by a method in which the individuality of the flow rate measuring means is taken into account in the second embodiment, the association can be prevented more reliably as compared with the first embodiment.

By the way, when a thermal flow sensor (capillary heating type thermal flow sensor) is used as a flow sensor, the conversion factor CF depends on the constant pressure molar specific heat CP of the gas in terms of its measurement principle. On the contrary to this, when a pressure flow sensor (e.g. a differential pressure type flow sensor) is used, the conversion factor CF depends on the viscosity coefficient $\eta$ of the gas in terms of its measurement principle. Specifically, when differential pressure AP between an upstream side and a downstream side of a differential pressure generating means (such as a laminar flow element) is constant, a flow rate Q of the gas is inversely proportional to the viscosity coefficient $\eta$. Therefore, when the viscosity coefficient $\eta$ changes due to association or dissociation of the associative gas, the change in the viscosity coefficient $\eta$ should be detectable as a change in the conversion factor CF when using a pressure-type flow sensor. Namely, the second embodiment of the present invention using the conversion factor CF can be applied to a case where a pressure type flow sensor is used as the flow sensor.

Third Embodiment

In the method according to a third embodiment of the present invention, in addition to the configuration of the second embodiment, the flow rate measuring means is a thermal flow sensor. Thermal flow sensors used in mass flow controllers are usually constituted by a sensor tube branched from a main flow passage of a gas and sensor wires wound at two positions, an upstream side and a downstream side of the sensor tube. Both the upstream and downstream sensor wires generate heat when energized, and supply heat to the gas flowing inside the sensor tube. When the gas inside the sensor tube flows, the temperature distribution in the sensor tube becomes asymmetrical, and a difference in resistance values of the sensor wires is caused. This difference in resistance values is detected as a potential difference proportional to a flow rate.

As mentioned above, the thermal flow sensor has a structure in which the gas is heated in terms of its measurement principle. For this reason, when measuring a flow rate of associative gas, there is a risk that the associative gas may be dissociated in the process of sensing. Since dissociation of associative gas is an endothermic reaction, the temperature difference between the upstream side and the downstream side of the sensor tube increases when the associative gas is dissociated due to heating of the sensor tube by the sensor wires. For this reason, it is considered that the flow rate of the associative gas measured by the thermal flow sensor is detected to be larger than that in a case where no dissociation occurs, and the conversion factor CF changes without being stabilized.

In accordance with the third embodiment, such a malfunction of the thermal flow sensor can be acutely detected as a change in the conversion factor CF. In accordance with the third embodiment, it is possible to determine the maximum permissible pressure $P_{max}(T)$ at which no association of the associative gas occurs and therefore no dissociation occurs inside the sensor tube. By adjusting the pressure $P_g$ of the associative gas so as not to exceed the maximum allowable pressure $P_{max}(T)$, the associative gas can be supplied without causing association.

Fourth Embodiment

In the method according to a fourth embodiment of the present invention, in addition to the configuration of the second embodiment, the pressure threshold $P_t(T)$ is determined under a condition that the stable region is defined as a region where a rate of change of the conversion factor CF with respect to change in a value of common logarithm of the pressure $P_g$ of the associative gas divided by the equilibrium vapor pressure $P_e(T_g)$ of the associative gas at the temperature $T_g$ is less than a predetermined threshold or the difference between the conversion factor $CF_0$ and the conversion factor CF is less than the predetermined threshold and the unstable region is defined as a region where the rate of change of the conversion factor CF with respect to change in a value of the common logarithm is not less than the predetermined threshold or the difference between the conversion factor $CF_0$ and the conversion factor CF is not less than the predetermined threshold. In the fourth embodiment, the boundary of the unstable region becomes clear by the common logarithm of the value of the pressure $P_g$ of the associative gas divided by the equilibrium vapor pressure $P_e(T_g)$ of the associative gas at the temperature $T_g$ instead of the value itself. Therefore, it becomes easier to determine the threshold value $P_t(T)$. A specific example thereof will be shown in an embodiment which will be mentioned later.

Fifth Embodiment

In the method according to a fifth embodiment of the present invention, in addition to the configuration of the first embodiment, a quotient obtained by dividing the equilibrium vapor pressure $P_e(T)$ by a safety factor SF is determined as the maximum allowable pressure $P_{max}(T)$. In the fifth embodiment, the step S3 for determining the maximum allowable pressure $P_{max}(T)$ based on the equilibrium vapor pressure $P_e(T)$ or the pressure threshold $P_t(T)$ in the first embodiment is further specified. The safety factor SF in the fifth embodiment is a ratio of the equilibrium vapor pressure $P_e(T)$ to the maximum allowable pressure $P_{max}(T)$ at the temperature T. This can be expressed numerically as shown in the following formula (1). Here, the safety factor SF is set as a constant independent of the temperature T.

$$P_{max}(T) = P_e(T)/SF \tag{1}$$

The safety factor SF may be any real number larger than 1, and may be an integer larger than 1. The larger the safety factor SF is, the more reliably association of associative gas can be prevented. It is considered that what value should be adopted as the safety factor SF varies depending on a type of associative gas and a configuration of a flow rate measuring means, etc. Therefore, the safety factor SF cannot be uniformly determined without considering these conditions. Similarly to the case where the maximum allowable pressure $P_{max}(T)$ is determined in the first embodiment, the safety factor SF and the maximum allowable pressure $P_{max}(T)$ can be determined by repeating experiments under various conditions, accumulating data, and analyzing the data also in the fifth embodiment.

Figure 3:
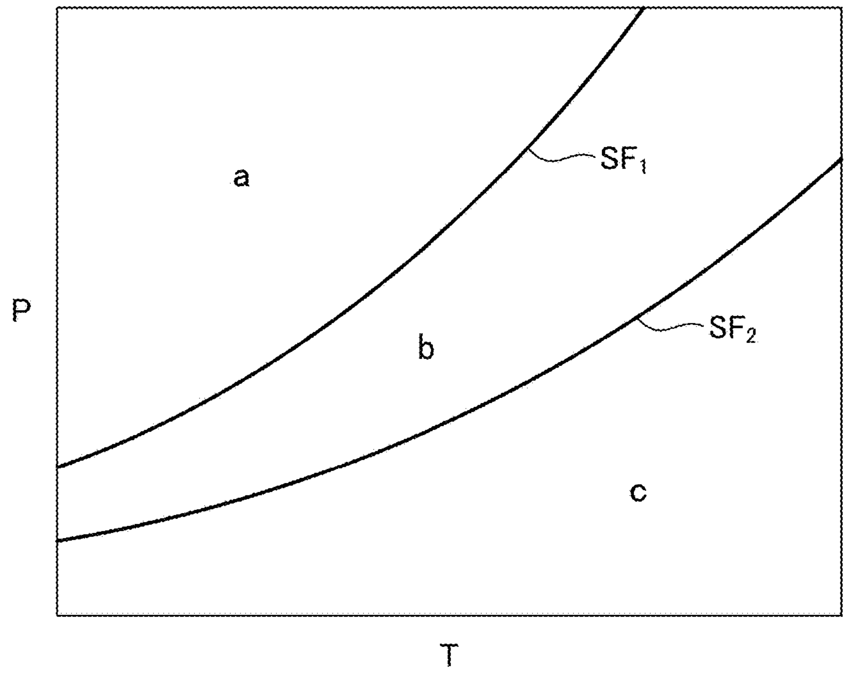
FIG. 3 is a graph for showing an example of the maximum allowable pressure determined for associative gas.

FIG. 3 is a graph for schematically showing an example of the maximum allowable pressure determined by carrying out the method according to the fifth embodiment. The horizontal axis represents the temperature T of the associative gas, and the vertical axis represents the pressure P of the associative gas. The curve marked with a symbol "$SF_1$" in the graph expresses the maximum allowable pressure $P_{max}(T)$ determined as the quotient obtained by setting the safety factor to $SF_1$ and dividing the equilibrium vapor pressure $P_e(T)$ of the associative gas by the safety factor $SF_1$. The shape of the curve in this graph is downwardly convex, reflecting a shape of a curve in a graph of the equilibrium vapor pressure $P_e(T)$. The curve marked with the symbol "$SF_2$" in the same graph expresses the maximum allowable pressure $P_{max}(T)$ determined as a quotient obtained by setting the safety factor to $SF_2$ and dividing the equilibrium vapor pressure $P_e(T)$ of the associative gas by the safety factor $SF_2$. Here, the safety factor $SF_2$ is a larger value than the safety factor $SF_1$.

The graph shown in FIG. 3 is divided into three regions designated by symbols a, b and c by the two curves $SF_1$ and $SF_2$. The region a is an unstable region in which the associative gas easily associates because the safety factor SF is smaller than $SF_1$ and the pressure P is high. The region b is an almost stable region in which association of the associative gas does not easily occur because the safety factor SF is larger than $SF_1$ and the pressure P is adjusted to be lower with respect to the equilibrium vapor pressure $P_e(T)$. The region c is an extremely stable region in which almost no association of the associative gas occurs because the safety factor SF is larger than $SF_2$ that is larger than $SF_1$ and the pressure P is adjusted lower with respect to the equilibrium vapor pressure $P_e(T)$.

In the region c, association of the associative gas can be reliably prevented. However, on the other hand, the associative gas must be maintained at low pressure or high temperature, and temperature and pressure conditions of the associative gas supplied to a semiconductor manufacturing apparatus are limited to a narrow range. On the other hand, although stability of the associative gas in the region b is slightly inferior to that in the region c, there is an advantage that restrictions on temperature and pressure are relaxed. In accordance with the fifth embodiment, association of associative gas is prevented within a reasonable temperature and pressure range for operation by selecting the safety factor SF suitable for the conditions of semiconductor production in a semiconductor manufacturing apparatus.

Sixth Embodiment

In a sixth embodiment of the present invention, unlike the first to fifth embodiments, the associative gas is limited to hydrogen fluoride gas. Moreover, although the safety factor SF is used to determine the maximum allowable pressure $P_{max}(T)$ similarly to the fifth embodiment, the value of the safety factor SF is limited to 5.0 or more. The method according to the sixth embodiment is a method for supplying hydrogen fluoride gas to a semiconductor manufacturing apparatus, including a step in which data of equilibrium vapor pressure $P_{ef}(T)$ as a function of temperature T for hydrogen fluoride gas is acquired, a step in which a safety factor SF is set to be 5.0 or more and a quotient obtained by dividing the equilibrium vapor pressure $P_{ef}(T)$ by the safety factor SF is determined as the maximum allowable pressure $P_{max}(T)$, a step in which temperature $T_f$ and pressure $P_f$ of hydrogen fluoride gas supplied to the semiconductor manufacturing apparatus are measured, and a step in which the pressure $P_f$ and/or the temperature $T_f$ are adjusted such that the pressure $P_f$ does not exceed a value of the maximum allowable pressure $P_{max}(T_f)$ at the temperature $T_f$.

As mentioned above, it is considered that an appropriate value of the safety factor SF is different depending on the type of the associative gas. As apparent from a working example which will be mentioned later, when hydrogen fluoride gas is selected as the associative gas, association can be prevented by setting the safety factor SF to 5.0 or more. Association can be more reliably prevented by setting the safety factor SF to 10 or more.

Seventh Embodiment

As mentioned above, in JP 2008-146641 previously filed by the present applicant, a method for preventing associative gas such as hydrogen fluoride gas from associating by setting temperature of a mass flow controller to 30° C. or higher and lower than 70° C. and setting pressure of the associative gas to 5 kilopascals or more and 40 kilopascals or less when supplying the associative gas to a processing apparatus is described. However, since hydrogen fluoride gas is more likely to associate as its temperature is lower and its pressure is higher, there may have been conditions where the association may occur even within limited ranges of temperature and pressure when the ranges are limited independently. Alternatively, conversely, there may have been conditions where the association may be prevented even temperature and pressure are deviated from the limited ranges, and there is a risk that the limitations may be excessive. Namely, J P 2008-146641 merely discloses a technical idea for determining suitable ranges of pressure and temperature independently, and it cannot be said that the technical idea according to the present invention in which preferred ranges of pressure and temperature are determined by considering the pressure and temperature at the same time.

On the other hand, the above-mentioned method according to the sixth embodiment of the present invention includes a step in which data of equilibrium vapor pressure $P_{ef}(T)$ as a function of temperature T for hydrogen fluoride gas is acquired, a step in which a safety factor SF is set to be 5.0 or more and a quotient obtained by dividing the equilibrium vapor pressure $P_{ef}(T)$ by the safety factor SF is determined as the maximum allowable pressure $P_{max}(T)$, a step in which temperature $T_f$ and pressure $P_f$ of hydrogen fluoride gas supplied to the semiconductor manufacturing apparatus are measured, and a step in which the pressure $P_f$ and/or the temperature $T_f$ are adjusted such that the pressure $P_f$ does not exceed a value of the maximum allowable pressure $P_{max}(T_f)$ at the temperature $T_f$. In accordance with this, it is possible to accurately supply a fixed amount of hydrogen fluoride gas to a semiconductor manufacturing apparatus by preventing hydrogen fluoride gas from associating and maintaining a dissociated state even at pressure $P_f$ and temperature $T_f$ at which JP 2008-146641 describes that hydrogen fluoride gas causes association and it is difficult to supply hydrogen fluoride gas at a set flow rate, namely temperature $T_f$ lower than 30° C. or pressure $P_f$ higher than 40 kilopascals, as long as the pressure $P_f$ does not exceed the value of the maximum allowable pressure $P_{max}(T_f)$ at a combination of the pressure $P_f$ and the temperature $T_f$.

Therefore, in the method according to the seventh embodiment of the present invention, in addition to the configuration of the sixth embodiment, the temperature $T_f$ of hydrogen fluoride gas is lower than 30° C. or the pressure $P_f$ is higher than 40 kilopascals. In the prior art described in JP 2008-146641, no method for supplying hydrogen fluoride gas to a semiconductor manufacturing apparatus at temperature lower than 30° C. or at pressure higher than 40 kilopascals was known. In accordance with the seventh embodiment, the pressure $P_f$ of hydrogen fluoride gas is adjusted so as not to exceed the maximum allowable pressure $P_{max}(T)$ determined based on the safety factor SF, and thereby hydrogen fluoride gas can be stably supplied even under certain conditions which are impossible in the prior art.

Eighth Embodiment

The method according to an eighth embodiment of the present invention further includes a step in which a flow rate $F_g$ of the associative gas supplied to the semiconductor manufacturing apparatus per unit time is measured using a flow rate measuring means, and a step in which the measured flow rate $F_g$ is controlled so as to be coincident with a preset flow rate $F_s$. Since the flow rate $F_g$ of the associative gas measured in the second embodiment is measured in a state where the pressure $P_g$ is adjusted so as not to exceed the maximum allowable pressure $P_{max}(T)$ and therefore the flow rate $F_g$ is a correct flow rate measured in a state where there is neither association nor dissociation of the associative gas. In accordance the eighth embodiment, since such a correct measured value $F_g$ is controlled to match the preset flow rate $F_s$, the associative gas whose flow rate is precisely controlled to the value of $F_s$ can be stably supplied to the semiconductor manufacturing apparatus. While controlling the flow rate $F_g$, it is preferable to repeatedly measure the flow rate $F_g$. The frequency of repeating the measurement can be properly determined depending on conditions such as an extent of change in the flow rate $F_g$.

<Working Example>

Figure 4:
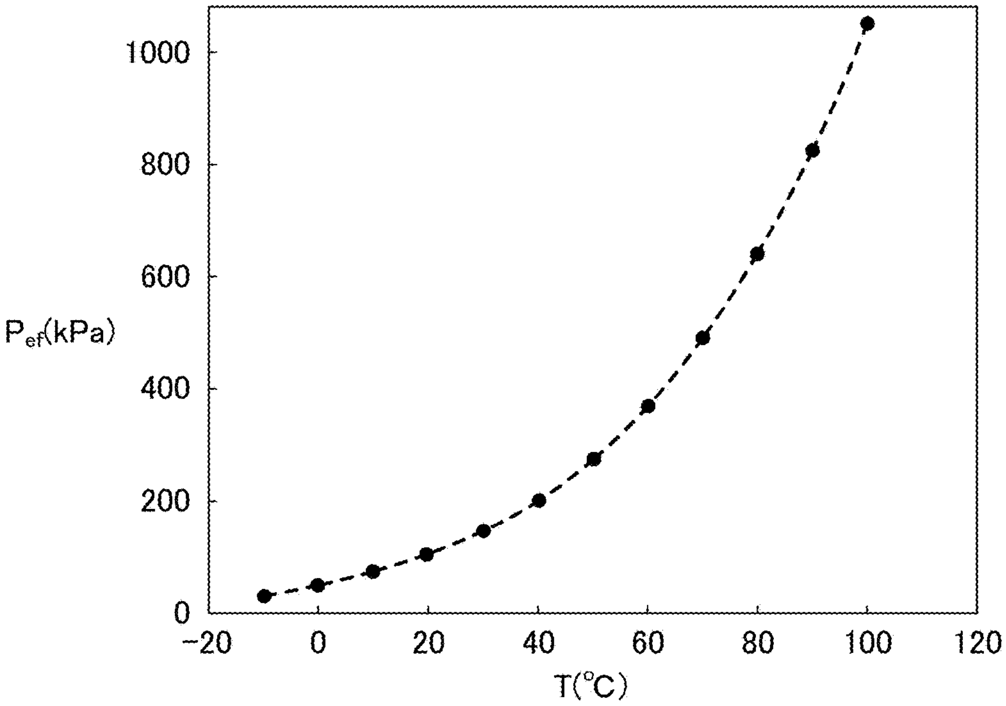
FIG. 4 is a graph for showing equilibrium vapor pressure of hydrogen fluoride gas.

Hydrogen fluoride gas was selected as the associative gas. Data of the equilibrium vapor pressure of hydrogen fluoride gas was obtained from the known Non-Patent Document 1, EUROFLUOR (CTEF), "GENERAL PROPERTIES OF ANHYDROUS HYDROGEN FLUORIDE (AHF) AND HYDROFLUORIC ACID SOLUTIONS (HF)", (Kingdom of Belgium), EUROFLUOR (CTEF), 2016.03.29, p. 10 (NPTL1). In this data, values of the equilibrium vapor pressure are shown discretely in 10° C. increments from −10° C. to 100° C. FIG. 4 is a graph for representing the data obtained according to the Non-Patent Document 1 (NPTL1). In this graph, the values of the equilibrium vapor pressure were fitted using a cubic equation with temperature as a variable. A correlation coefficient in this approximation was 0.99997. By using this approximation, data of the equilibrium vapor pressure $P_{ef}(T)$ of hydrogen fluoride gas as a function of an arbitrary temperature T was obtained.

Figure 5:
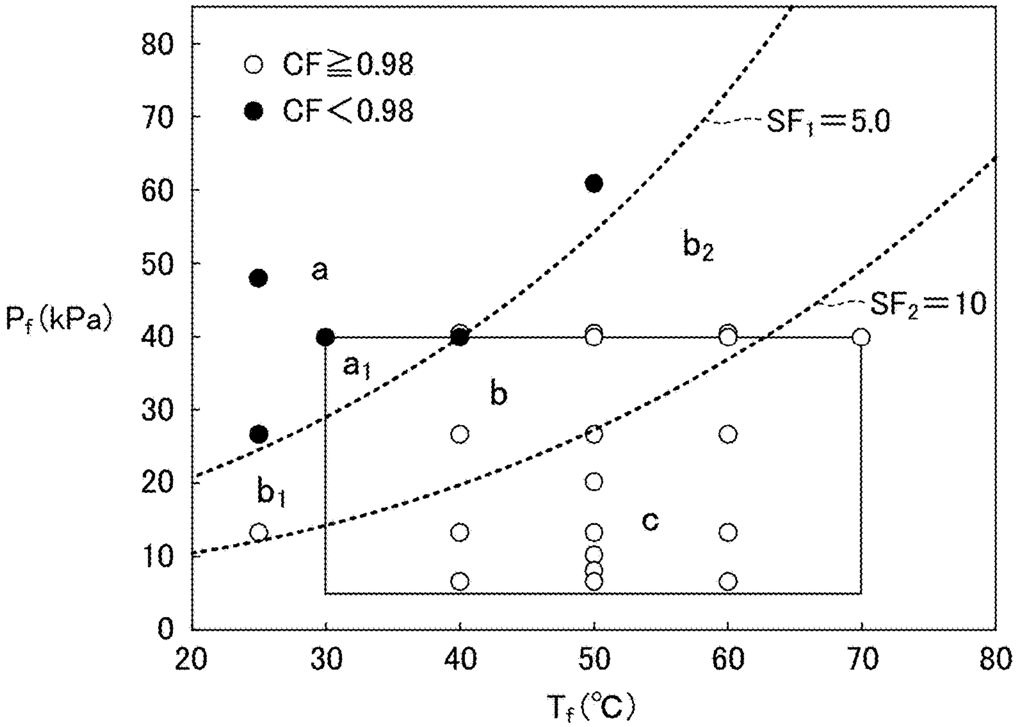
FIG. 5 is a graph for showing a stable region and an unstable region of hydrogen fluoride gas.

Next, a plurality of mass flow controllers comprising thermal flow sensors calibrated with nitrogen gas were prepared, and a value of the conversion factor CF of hydrogen fluoride gas at certain temperatures and pressures was acquired. Test temperatures were 25° C., 30° C., 40° C., 50° C., 60° C. and 70° C., and test pressures was in a range from 5.3 kilopascals to 134 kilopascals. In FIG. 5, measurement points where the conversion factor CF was 0.98 or more are indicated as white circles and measurement points where the conversion factor CF was smaller than 0.98 are indicated as black circles on a graph with a horizontal axis representing the temperature $T_f$ and a vertical axis representing the pressure $P_f$ when determining the conversion factor CF of hydrogen fluoride gas.

In FIG. 5, the region of temperature $T_f$ and pressure $P_f$ where the white circles exist is a stable region where the conversion factor CF is close to 1.0 and does not change much regardless of the difference in temperature and pressure. It is known that the conversion factor CF of hydrogen fluoride gas exhibits a value close to 1.0 when no association occurs (refer to JP 2008-146641, for example). This is considered to be arisen from a fact that the constant pressure specific heat values of nitrogen gas and hydrogen fluoride gas sufficiently coincide by chance (approximately 29 kJ/mol). In other words, the fact that the conversion factor CF shows a simple value of 1.0 is just a coincidence and has no other physical or chemical meaning. It is thought that association of hydrogen fluoride gas is unlikely to occur in the stable region where the white circles exist. In this working example, a value of the conversion factor $CF_0$ in a state where associative gas is not associated according to the second embodiment of the present invention is 1.0. Moreover, in the stable region where the white circle mark exists, the difference between the conversion factor $CF_0$ and the conversion factor CF is less than the predetermined threshold value of 0.02.

In FIG. 5, the region of temperature $T_f$ and pressure $P_f$ where the black circles exist is an unstable region in which the conversion factor CF changes significantly in response to change in temperature or pressure. The black circles are concentrated in an upper left region of the graph, namely in a region where the temperature $T_f$ is low and the pressure $P_f$ is high. It is thought that association of hydrogen fluoride gas is likely to occur in this region. In the unstable region where the black circles exist, the difference between the conversion factor $CF_0$ and the conversion factor CF in the second embodiment of the present invention is larger than or equal to the predetermined threshold of 0.02. In FIG. 5, the stable region and the unstable region of hydrogen fluoride gas are demarcated based on the conversion factor CF that is a parameter sensitive to the influence of association.

In FIG. 5, in addition to the white and black circles, curves representing the maximum allowable pressure $P_{max}(T)$ determined when the safety factor $SF_1$ is equal to 5.0 and when the safety factor $SF_2$ is equal to 10 are illustrated as dotted lines, respectively. As in the case of FIG. 3, FIG. 5 can be divided into three regions of the region a in which the safety factor SF is smaller than $SF_1$, the region b in which the safety factor SF is larger than $SF_1$ and smaller than $SF_2$, and the region c in which the safety factor SF is larger than $SF_2$. In addition, the region surrounded by a square in FIG. 5 represents a region in which the temperature is 30° C. or more and less than 70° C. and the pressure is 5 kilopascal or more and 40 kilopascals or less, which is defined as a region in which hydrogen fluoride gas association is unlikely to occur in JP 2008-146641.

In accordance with FIG. 5, the region a matches well with the unstable region determined from the value of the conversion factor CF. In addition, the regions b and c match well with the stable region determined from the value of the conversion factor CF. Therefore, these data provide a rational basis for setting the safety factor $SF_1$ to 5.0 or more in the sixth embodiment of the present invention. The boundary between the region a and the region b corresponds to the pressure threshold $P_t(T)$ in the second embodiment of the present invention.

In accordance with FIG. 5, it can be seen that the portion $a_1$ which overlaps with the region where association of hydrogen fluoride gas was considered unlikely to occur in JP 2008-146641 is considered to be a region in which the safety factor SF is smaller than 5.0 and association is likely to occur actually. On the contrary to this, within the region b, the region $b_1$ where the temperature $T_f$ is lower than 30° C. and the region $b_2$ where the pressure $P_f$ is higher than 40 kilopascals, namely regions corresponding to the seventh embodiment of the present invention, were considered to be regions in which association is likely to occur and therefore which should be avoided in JP 2008-146641. However, it can be seen that these regions are considered to be regions in which the safety factor SF is larger than 5.0 and association is unlikely to occur actually. Namely, in accordance with the sixth embodiment of the present invention exemplified in FIG. 5, a part of the region where association of hydrogen fluoride gas was considered to be able to be prevented in the prior art can be corrected to a region which can be considered to be more rational and correct. In other words, even in the region considered to be a region in which association is likely to occur and therefore which should be avoided in JP 2008-146641, as long as the combination of pressure $P_f$ and temperature $T_f$ does not exceed the maximum allowable pressure $P_{max}(T)$, hydrogen fluoride gas can be prevented from associating and a dissociated state can be maintained, and thereby hydrogen fluoride gas can be accurately and quantitatively supplied to a semiconductor manufacturing apparatus by.

Figure 6:
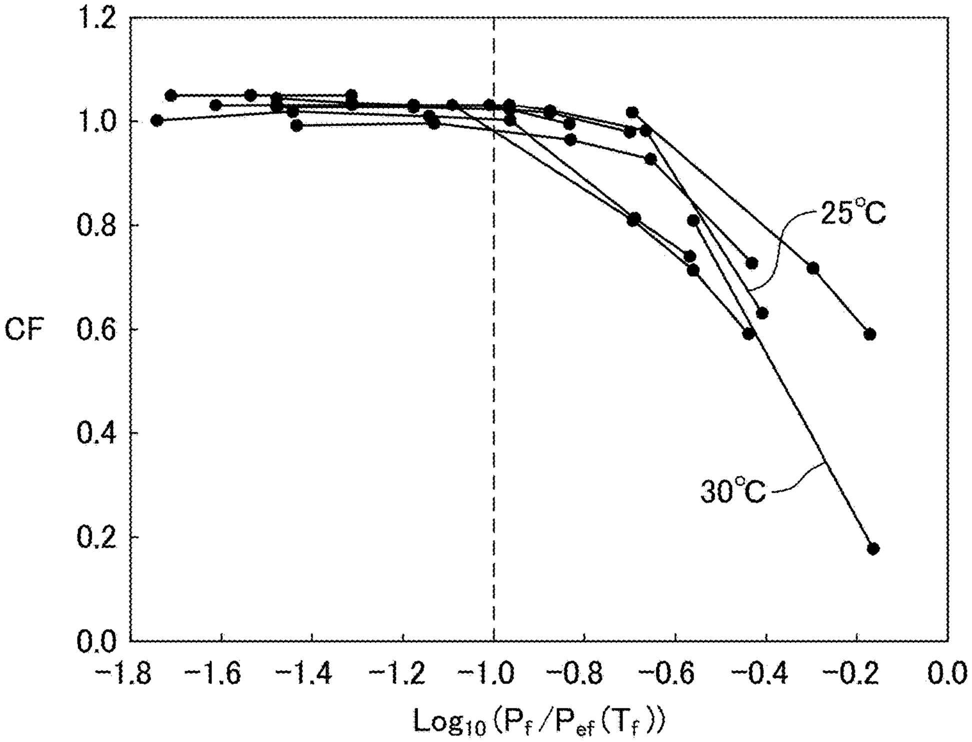
FIG. 6 is a graph for showing a relation between a common logarithm of normalized pressure of hydrogen fluoride gas and a conversion factor CF.

Next, the data of the conversion factor CF data organized using logarithms is exemplified. In FIG. 6, the same data of the conversion factors CF as those used in FIG. 5 is indicated on a semilogarithmic graph with a horizontal axis representing a common logarithm of a value of the pressure $P_f$ of hydrogen fluoride gas divided by the equilibrium vapor pressure $P_{ef}(T_f)$ of hydrogen fluoride gas at the temperature $T_f$ and a vertical axis representing values of the conversion factor CF. In this specification, the value obtained by dividing the pressure P by the equilibrium vapor pressure $P_e(T)$ of the associative gas at the temperature T may be referred to as "normalized pressure." In the graph shown in FIG. 6, plots connected by straight lines indicate data obtained using the same mass flow controller. There is a total of 13 such data sets. The specifications of the mass flow controllers used to measure these data are not unified, and there are differences in rated flow rates, structures of thermal flow sensors, sizes of flow passages, etc. Nevertheless, a certain trend as described below is shown in the graph of the data shown in FIG. 6.

First, on the left side of the graph, namely the side where the pressure $P_f$ is low, all the conversion factors CFs of 13 sets of mass flow controllers showed values close to 1.0 regardless of the difference in temperature and pressure. This indicates that association of hydrogen fluoride gas is difficult to occur in this region, as mentioned above. Next, on the right side from the center of the graph, namely the side where the pressure $P_f$ is high, it can be seen that the value of the conversion factor CF gradually deviates from 1.0 and decreases. Decrease in the conversion factor CF becomes more remarkable as the pressure increases. This tendency is also common to the 13 sets of data, and all the plots draw curves almost close to each other. As mentioned above, such a rapid change in the conversion factor CF cannot be explained only by the temperature change in the constant pressure specific heat of hydrogen fluoride gas, but it suggests that hydrogen fluoride gas is associated in a region with high pressure.

From the overall tendency shown in the graph of FIG. 6 as explained above, the following can be certainly prospected. Namely, when the common logarithm of the value obtained by dividing the pressure $P_f$ of hydrogen fluoride gas by the equilibrium vapor pressure $P_{ef}(T_f)$ at its temperature $T_f$ does not exceed −1.0 under the experimental conditions of this working example, namely when the normalized pressure value is less than 0.1, association of hydrogen fluoride gas is reliably suppressed. When the experimental facts shown in FIG. 6 are applied to the second embodiment, the pressure threshold $P_t(T)$ corresponding to the boundary between the stable region where the conversion factor CF does not change much and the unstable region where the conversion factor CF changes largely can be determined to be a value one-tenth of the vapor pressure $P_{ef}(T)$. The broken line shown in FIG. 6 indicates the boundary between the stable region and the unstable region determined in this way. In addition, when the experimental facts shown in FIG. 6 are applied to the fifth embodiment, the safety factor SF can be determined to be 10.

As exemplified above, it can be seen that, regarding the ranges of the temperature $T_f$ and the pressure $P_f$ at which hydrogen fluoride gas can be supplied while preventing association of the hydrogen fluoride gas, excesses and deficiencies inherent in the prior art can be corrected and more rational and accurate adjustment becomes possible in accordance with the present invention, <Comparative Example>

Figure 7:
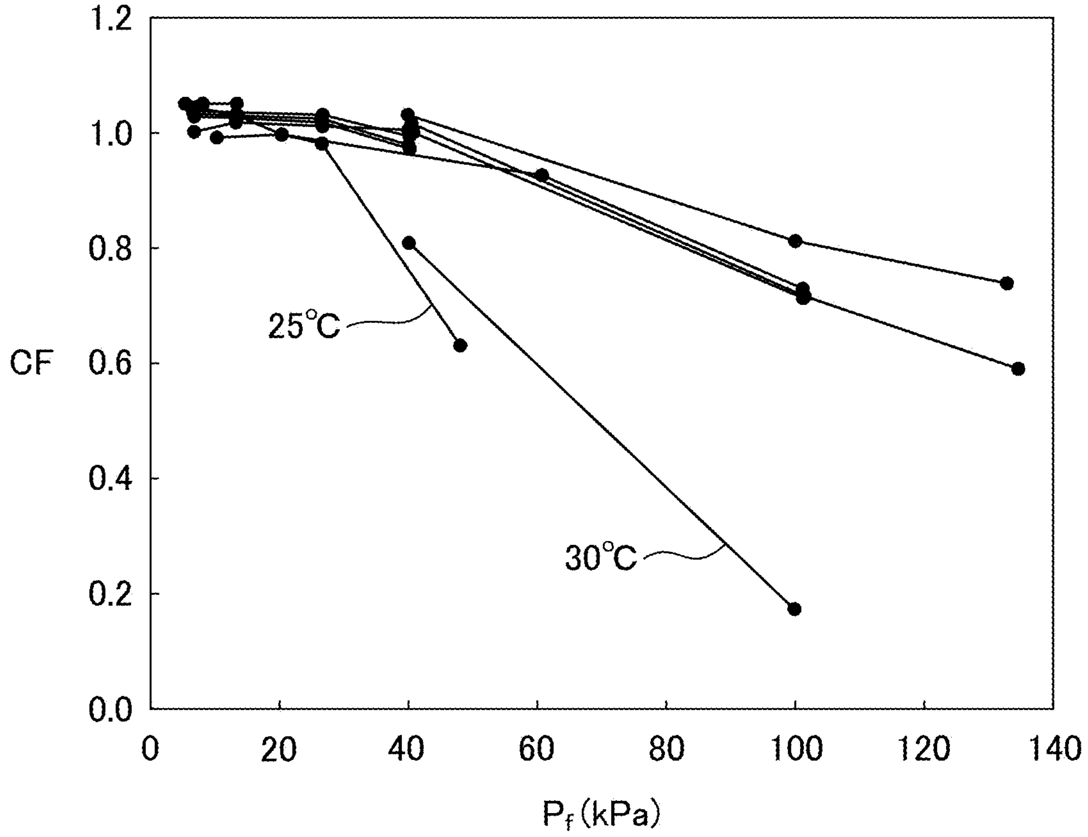
FIG. 7 is a graph for showing a relation between pressure of hydrogen fluoride gas and conversion factors CFs according to the prior art.

In FIG. 7, the same data as those exemplified in FIG. 6 is represented on a graph with a horizontal axis representing the pressure $P_f$ of hydrogen fluoride gas and a vertical axis representing values of the conversion factor CF. The horizontal axis of this graph is not normalized by the equilibrium vapor pressure Pef(T) of hydrogen fluoride gas, and the data of the conversion factor CF is simply organized by the pressure $P_f$.

As compared with the graph shown in FIG. 6, the conversion factor CF has already begun to decrease when the pressure P f exceeds 20 kilopascals in the plots in FIG. 7, and the threshold at which the CF starts to decrease cannot be clearly defined. In addition, at 25° C. and 30° C. in a low temperature range, since the CF decreases extremely when the pressure $P_f$ exceeds 20 kilopascals, it is thought to be judged that the pressure of hydrogen fluoride gas should be uniformly less than 20 kilopascals from this graph. Namely, it can be seen that there is a risk of incorrect judgment being made regarding the stable region of hydrogen fluoride gas despite that there is a region in which association can be prevented even though the pressure $P_f$ exceeds 20 kilopascals depending on temperature conditions in accordance with conventional methods which are not based on data of the equilibrium vapor pressure $P_{ef}(T)$ of hydrogen fluoride gas.

In the above description, the embodiments for carrying out the present invention, including the working example, have been explained in detail, referring to the drawings. These explanations are merely exemplification of embodiments for carrying out the present invention, and embodiments of the present invention are not limited to the embodiments exemplified here. The present invention can be implemented by changing a part of its configuration regardless of whether or not it is explicitly stated in the specification and drawings, unless departing from the technical idea explained here.

The invention claimed is:

1. A method for supplying associative gas which is likely to cause association to a semiconductor manufacturing apparatus, including:

a step in which one associative gas is selected for the purpose of using in manufacture of semiconductor devices, a step in which data of equilibrium vapor pressure $P_e(T)$ as a function of temperature T for the selected associative gas is acquired, a step in which the maximum allowable pressure $P_{max}(T)$ at which the associative gas can be supplied without causing association is determined based on the data of the equilibrium vapor pressure $P_e(T)$, a step in which temperature $T_g$ and pressure $P_g$ of the associative gas supplied to the semiconductor manufacturing apparatus are measured, a step in which a value of the maximum allowable pressure $P_{max}(T_g)$ at the measured temperature $T_g$ is determined, and a step in which the pressure $P_g$ and/or the temperature $T_g$ are adjusted such that the measured pressure $P_g$ does not exceed a value of the determined maximum allowable pressure $P_{max}(T_g)$; and further including:

a step in which, with respect to a flow rate measuring means for measuring a flow rate of associative gas supplied to a semiconductor manufacturing apparatus per unit time, conversion factors CFs of the associative gas are determined at various temperature $T_g$ and pressure $P_g$ using a calibration gas which is less likely to cause association as a reference, a step in which a pressure threshold $P_t(T)$ corresponding to a boundary between a stable region and an unstable region is determined based on the data of the equilibrium vapor pressure $P_e(T)$, the stable region is a region where a rate of change of the conversion factor CF with respect to change in the temperature $T_g$ and/or pressure $P_g$ of the associative gas is less than a predetermined threshold or a difference between a conversion factor $CF_0$ in a state where the associative gas is not associated and the conversion factor CF is less than a predetermined threshold value, and the unstable region is a region where the rate of change of the conversion factor CF with respect to change in the temperature $T_g$ and/or pressure $P_g$ of the associative gas is not less than the predetermined threshold or the difference between the conversion factor $CF_0$ and the conversion factor CF is not less than the predetermined threshold value, and a step in which the maximum allowable pressure $P_{max}(T)$ is determined based on the determined pressure threshold $P_t(T)$.

2. The method according to claim 1, wherein the flow rate measuring means is a thermal flow sensor.

3. The method according to claim 1, wherein:

the pressure threshold $P_t(T)$ is determined under a condition that the stable region is defined as a region where a rate of change of the conversion factor CF with respect to change in a value of common logarithms of the pressure $P_g$ of the associative gas divided by the equilibrium vapor pressure $P_e(T_g)$ of the associative gas at the temperature $T_g$ is less than a predetermined threshold or the difference between the conversion factor $CF_0$ and the conversion factor CF is less than the predetermined threshold and the unstable region is defined as a region where the rate of change of the conversion factor CF with respect to change in a value of the common logarithms is not less than the predetermined threshold or a difference between the conversion factor $CF_0$ and the conversion factor CF is not less than the predetermined threshold.

4. The method according to claim 1, further including:

a step in which a flow rate $F_g$ of the associative gas supplied to the semiconductor manufacturing apparatus per unit time is measured using a flow rate measuring means, and a step in which the measured flow rate $F_g$ is controlled so as to be coincident with a preset flow rate $F_s$.

5. A method for supplying associative gas which is likely to cause association to a semiconductor manufacturing apparatus, including:

a step in which one associative gas is selected for the purpose of using in manufacture of semiconductor devices, a step in which data of equilibrium vapor pressure $P_e(T)$ as a function of temperature T for the selected associative gas is acquired, a step in which the maximum allowable pressure $P_{max}(T)$ at which the associative gas can be supplied without causing association is determined based on the data of the equilibrium vapor pressure $P_e(T)$, a step in which temperature $T_g$ and pressure $P_g$ of the associative gas supplied to the semiconductor manufacturing apparatus are measured, a step in which a value of the maximum allowable pressure $P_{max}(T_g)$ at the measured temperature $T_g$ is determined, and a step in which the pressure $P_g$ and/or the temperature $T_g$ are adjusted such that the measured pressure $P_g$ does not exceed a value of the determined maximum allowable pressure $P_{max}(T_g)$, and a quotient obtained by dividing the equilibrium vapor pressure $P_e(T)$ by a safety factor SF is determined as the maximum allowable pressure $P_{max}(T)$.

6. A method for supplying hydrogen fluoride gas that is associative gas to a semiconductor manufacturing apparatus, including:

a step in which data of equilibrium vapor pressure $P_{ef}(T)$ as a function of temperature T for hydrogen fluoride gas is acquired, a step in which a safety factor SF is set to be 5.0 or more and a quotient obtained by dividing the equilibrium vapor pressure $P_{ef}(T)$ by the safety factor SF is determined as the maximum allowable pressure $P_{max}(T)$, a step in which temperature $T_f$ and pressure $P_f$ of hydrogen fluoride gas supplied to the semiconductor manufacturing apparatus are measured, and a step in which the pressure $P_f$ and/or the temperature $T_f$ are adjusted such that the pressure $P_f$ does not exceed a value of the maximum allowable pressure $P_{max}(T_f)$ at the temperature $T_f$.

7. The method according to claim 6, wherein:

the temperature $T_f$ of hydrogen fluoride gas is lower than 30° C. or the pressure $P_f$ is higher than 40 kilopascals.

* * * * *